US009899582B2

(12) United States Patent
Min et al.

(10) Patent No.: US 9,899,582 B2
(45) Date of Patent: Feb. 20, 2018

(54) LIGHT SOURCE MODULE

(71) Applicant: LG Innotek Co., Ltd., Seoul (KR)

(72) Inventors: Byeong Guk Min, Seoul (KR); Seung Hyuk Lee, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 15/329,963

(22) PCT Filed: Jul. 29, 2015

(86) PCT No.: PCT/KR2015/007934
§ 371 (c)(1),
(2) Date: Jan. 27, 2017

(87) PCT Pub. No.: WO2016/018071
PCT Pub. Date: Feb. 4, 2016

(65) Prior Publication Data
US 2017/0250328 A1 Aug. 31, 2017

(30) Foreign Application Priority Data

Jul. 30, 2014 (KR) .................. 10-2014-0097006

(51) Int. Cl.
*H01L 33/00* (2010.01)
*H01L 33/62* (2010.01)
(Continued)

(52) U.S. Cl.
CPC ............ *H01L 33/62* (2013.01); *H01L 33/486* (2013.01); *H01L 33/502* (2013.01); *F21K 9/27* (2016.08);
(Continued)

(58) Field of Classification Search
CPC .................................................. H01L 33/486
See application file for complete search history.

(56) References Cited

U.S. PATENT DOCUMENTS

| 2008/0179620 A1* | 7/2008 | Chang ............... H01L 33/52 257/99 |
| 2011/0186880 A1 | 8/2011 | Kohler et al. |
| 2012/0056215 A1* | 3/2012 | Lee ................ F21K 9/00 257/88 |

FOREIGN PATENT DOCUMENTS

| JP | 2000-183406 A | 6/2000 |
| KR | 10-2010-0092844 A | 8/2010 |

(Continued)

*Primary Examiner* — Samuel Gebremariam
(74) *Attorney, Agent, or Firm* — Birch, Stewart, Kolasch & Birch, LLP

(57) ABSTRACT

A light source module including a body in which a light emitting device is disposed may be provided. The body includes: a main body including a top surface, a bottom surface, a first side, and a second side; a first subsidiary body disposed on the first side of the main body; and a second subsidiary body disposed on the second side of the main body. The first subsidiary body includes a first extension part extending from the first side and a second extension part extending from the first extension part. Each of the first extension part and the second extension part has a top surface and a bottom surface. The bottom surface of the first extension part and the bottom surface of the second extension part are disposed on the same plane with the bottom surface of the main body. The top surface of the first extension part is disposed lower than the top surface of the second extension part and the top surface of the main body, and the top surface of the second extension part is disposed lower than the top surface of the main body. The second subsidiary body is symmetrical with the first subsidiary body with respect to the main body. The light source module according to the embodiment can be mechanically coupled to another light source module having the same body as that of the light source module. The light source module according to the embodiment can provide a light source which is (Continued)

obtained by connecting a plurality of the light source modules and thus has a user's desired length. The light source module according to the embodiment can be used a light source of various lighting products, for example, a fluorescent lamp, a flat panel lighting device, etc.

18 Claims, 14 Drawing Sheets

(51) Int. Cl.
  *H01L 33/48* (2010.01)
  *H01L 33/50* (2010.01)
  *F21Y 115/10* (2016.01)
  *F21Y 103/10* (2016.01)
  *F21Y 105/16* (2016.01)
  *F21K 9/27* (2016.01)

(52) U.S. Cl.
  CPC ....... *F21Y 2103/10* (2016.08); *F21Y 2105/16* (2016.08); *F21Y 2115/10* (2016.08)

(56) References Cited

FOREIGN PATENT DOCUMENTS

| KR | 10-2012-0046917 A | 5/2012 |
| KR | 10-1304611 B1 | 9/2013 |

* cited by examiner (a)

(b)

(a)

(b)

(a)

(b)

LIGHT SOURCE MODULE

CROSS REFERENCE TO RELATED APPLICATIONS

This application is the National Phase of PCT International Application No. PCT/KR2015/007934, filed on Jul. 29, 2015, which claims priority under 35 U.S.C. 119(a) to Patent Application No. 10-2014-0097006, filed in Republic of Korea on Jul. 30, 2014, all of which are hereby expressly incorporated by reference into the present application.

TECHNICAL FIELD

The present disclosure relates to a light source module.

BACKGROUND ART

A light emitting diode (LED) is a semiconductor element for converting electric energy into light. As compared with existing light sources such as a fluorescent lamp, an incandescent lamp, etc., the LED has advantages of low power consumption, a semi-permanent span of life, a rapid response speed, safety and an environment-friendliness. Therefore, many researches are devoted to substitution of the existing conventional light sources with the LED. The LED is now being increasingly used as a light source module for a lighting device, such as, various lamps used interiorly and exteriorly, a liquid crystal display device, an electric sign and a street lamp and the like.

DISCLOSURE

Technical Problem

An embodiment of the present invention provides a light source module capable of being mechanically coupled to another light source module having the same body as that of the light source module.

The embodiment provides the light source module in which two light emitting devices respectively disposed on two mechanically coupled light source modules can be disposed on the same plane.

The embodiment provides the light source module obtained through two light source modules which can be not only mechanically coupled to each other, but also be electrically connected to each other.

The embodiment provides the light source module capable of providing a light source which is obtained by connecting a plurality of the light source modules and thus has a user's desired length.

The embodiment provides the light source module which can be used a light source of various lighting products, for example, a fluorescent lamp, a flat panel lighting device, etc.

Technical Solution

One embodiment is a light source module including a body in which a light emitting device is disposed. The body includes: a main body including a top surface, a bottom surface, a first side, and a second side; a first subsidiary body disposed on the first side of the main body; and a second subsidiary body disposed on the second side of the main body. The first subsidiary body includes a first extension part extending from the first side and a second extension part extending from the first extension part. Each of the first extension part and the second extension part has a top surface and a bottom surface. The bottom surface of the first extension part and the bottom surface of the second extension part are disposed on the same plane with the bottom surface of the main body. The top surface of the first extension part is disposed lower than the top surface of the second extension part and the top surface of the main body, and the top surface of the second extension part is disposed lower than the top surface of the main body. The second subsidiary body is symmetrical with the first subsidiary body with respect to the main body.

A sum of a length from the bottom surface of the first extension part to the top surface of the first extension part and a length from the bottom surface to the top surface of the second extension part may be the same as or less than a length from the bottom surface to the top surface of the main body.

The light emitting device may include: a case which is disposed on the top surface of the main body and includes a light emitting chip therein; a cap which is disposed on the case and covers the light emitting chip; and a lead frame which is connected to the case and is electrically connected to the light emitting chip. The lead frame may be disposed on the top surface of the main body, on the first side of the main body, and on the top surface of the first extension part.

The cap may include phosphor.

The light emitting device may include: a case which is disposed on the bottom surface of the main body and includes a light emitting chip therein; a cap which is disposed on the case and covers the light emitting chip; and a lead frame which is connected to the case and is electrically connected to the light emitting chip. The first extension part may have a hole. The second extension part may include an inner side surface and an outer side surface. The lead frame may be disposed on the bottom surface of the main body, on the bottom surface of the first extension part, on the hole of the first extension part, and on the inner side surface and the top surface of the second extension part.

The cap may include phosphor.

The light emitting device may include: a case which is disposed on the bottom surface of the main body and includes a light emitting chip therein; a cap which is disposed on the case and covers the light emitting chip; and a lead frame which is connected to the case and is electrically connected to the light emitting chip. The second extension part may include an inner side surface and an outer side surface. The lead frame may be disposed on the bottom surface of the main body, on the bottom surface of the first extension part, and on the bottom surface and the outer side surface of the second extension part.

The lead frame may be disposed on the top surface of the second extension part.

The cap may include phosphor.

Another embodiment is a light source module including a body in which a light emitting device is disposed. The body includes: a main body including a top surface, a bottom surface, a first side, and a second side; a first subsidiary body disposed on the first side of the main body; and a second subsidiary body disposed on the second side of the main body. The first subsidiary body includes a first extension part extending from the first side and a second extension part extending from the first extension part. Each of the first extension part and the second extension part has a top surface and a bottom surface. The bottom surface of the first extension part and the bottom surface of the second extension part are disposed on the same plane with the bottom surface of the main body. The top surface of the first extension part is disposed lower than the top surface of the second extension part and the top surface of the main body, and the top surface of the second extension part is disposed lower than the top surface of the main body. The second subsidiary body is symmetrical with the first subsidiary body with respect to an internal center point of the main body.

A sum of a length from the bottom surface of the first extension part to the top surface of the first extension part and a length from the bottom surface to the top surface of the second extension part may be the same as or less than a length from the bottom surface to the top surface of the main body.

The second subsidiary body may include a first extension part extending from an upper portion of the second side and a second extension part extending from the first extension part. Each of the first extension part of the second subsidiary body and the second extension part of the second subsidiary body may include a top surface and a bottom surface. The second extension part of the second subsidiary body may include an outer side surface and an inner side surface. The light emitting device may include: a case which is disposed on the top surface of the main body and includes a light emitting chip therein; a cap which is disposed on the case and covers the light emitting chip; and a first and a second lead frame which is connected to the case and is electrically connected to the light emitting chip. The first lead frame may be disposed on the top surface of the main body, on the first side of the main body, and on the top surface of the first extension part of the first subsidiary body. The second lead frame may be disposed on the top surface of the main body, on the top surface of the first extension part of the second subsidiary body, and on the top surface, the outer side surface, and the bottom surface of the second extension part of the second subsidiary body.

The cap may include phosphor.

The first lead frame may be disposed on the top surface of the second extension part of the first subsidiary body. The second lead frame may be disposed the bottom surface of the first extension part of the second subsidiary body.

Further another is a light source module including a body and a lead frame disposed on the body. The body includes: a main body including a top surface, a bottom surface, a first side, and a second side; a first subsidiary body disposed on the first side of the main body; and a second subsidiary body disposed on the second side of the main body. The first subsidiary body includes a first extension part extending from the first side and a second extension part extending from the first extension part. Each of the first extension part and the second extension part may have a top surface and a bottom surface. The bottom surface of the first extension part and the bottom surface of the second extension part may be disposed on the same plane with the bottom surface of the main body. The top surface of the first extension part may be disposed lower than the top surface of the second extension part and the top surface of the main body, and the top surface of the second extension part is disposed lower than the top surface of the main body. The lead frame may be disposed on the top surface of the main body, on the first side of the main body, and on the top surface of the first extension part.

The second subsidiary body may be symmetrical with the first subsidiary body with respect to the main body.

The second subsidiary body may be symmetrical with the first subsidiary body with respect to an internal center point of the main body.

A plurality of the lead frames may be disposed separately from each other.

Advantageous Effects

The light source module according to the embodiment can be mechanically coupled to another light source module having the same body as that of the light source module.

Two light emitting devices respectively disposed on two mechanically coupled light source modules can be disposed on the same plane.

The two light source modules can be not only mechanically coupled to each other, but also be electrically connected to each other.

The light source module according to the embodiment provides a light source which is obtained by connecting a plurality of the light source modules and thus has a user's desired length.

The light source module according to the embodiment can be used a light source of various lighting products, for example, a fluorescent lamp, a flat panel lighting device, etc.

Figure 5:
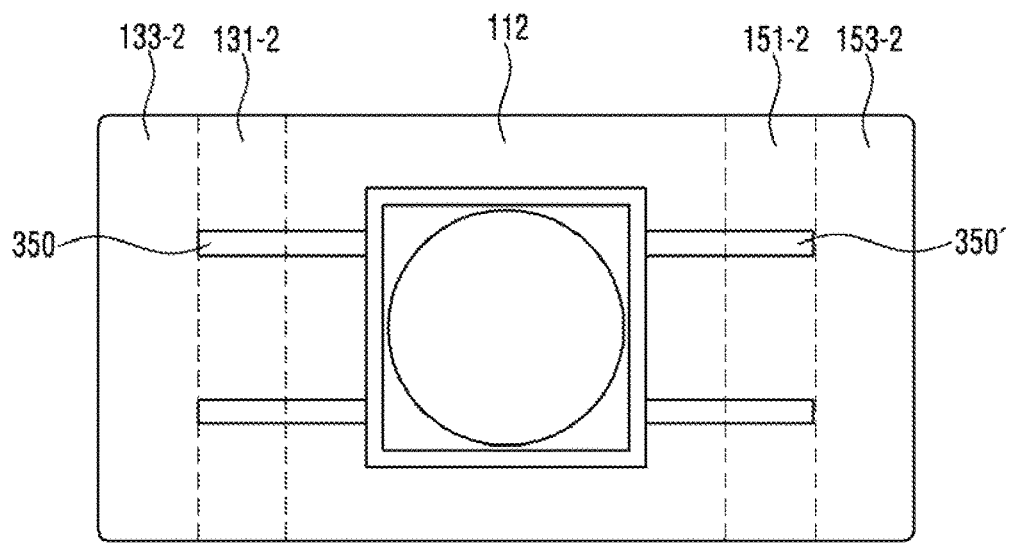
FIG. 5 is a plan view of the light source module shown in FIG. 4.
Figure 6:
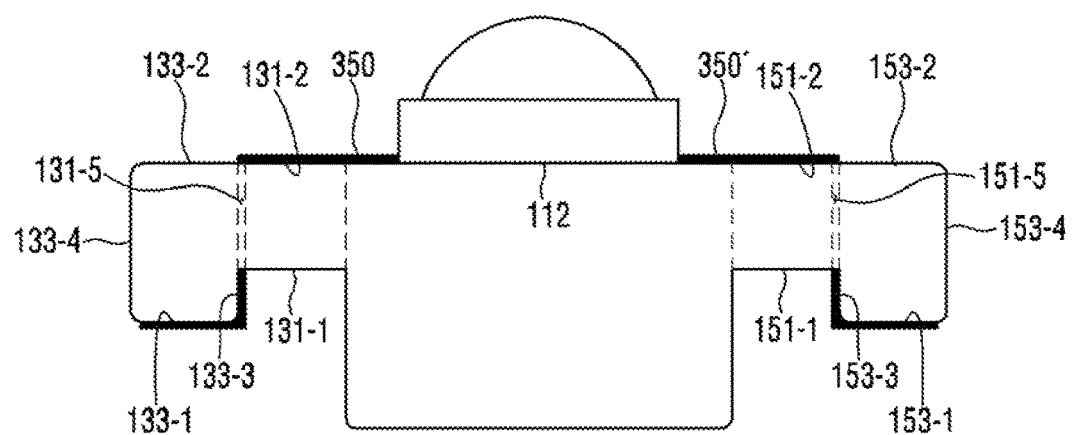
FIG. 6 is a side view of the light source module shown in FIG. 4.
Figure 7:
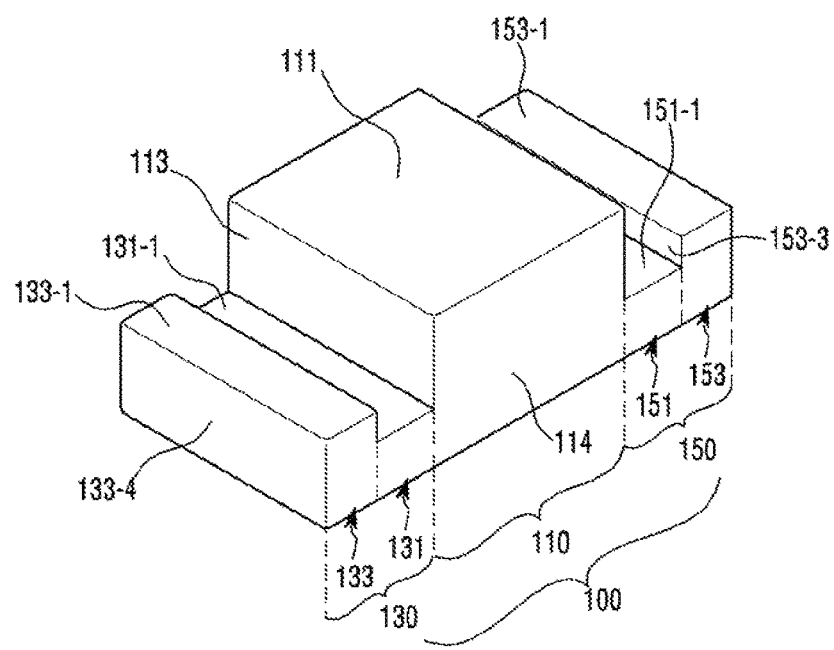
Figure 7:
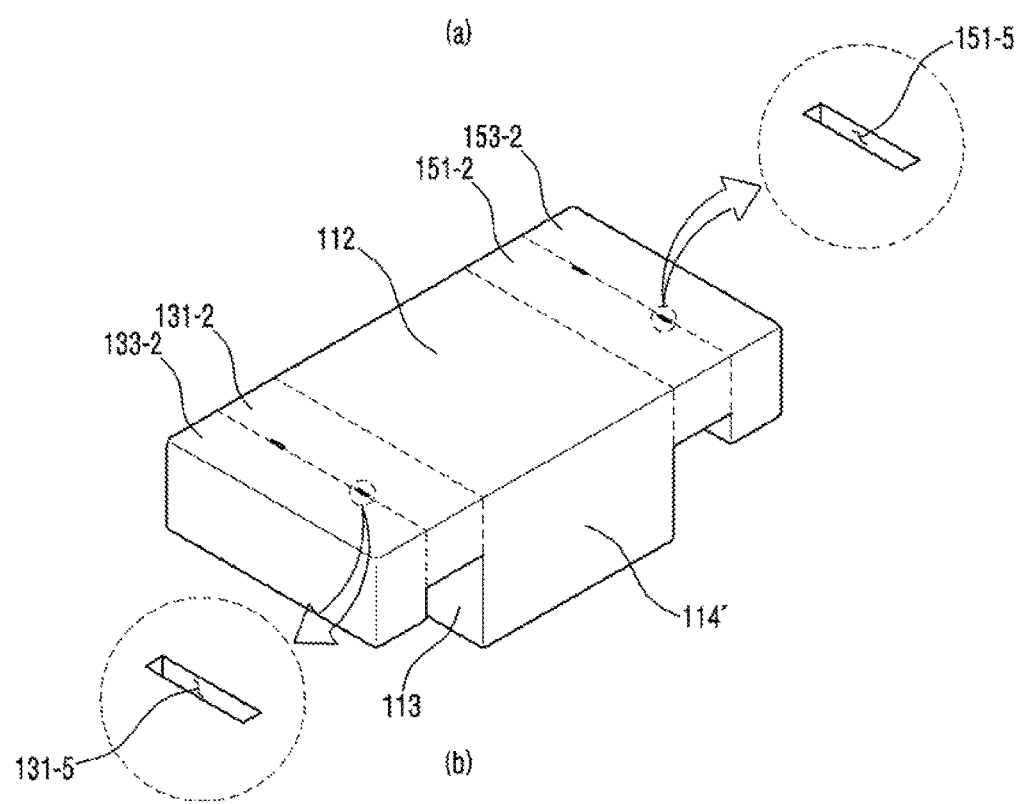

A perspective view of a body 100 shown in FIGS. 1 to 6 is shown in (a) to (b) of FIG. 7.

Figure 4:
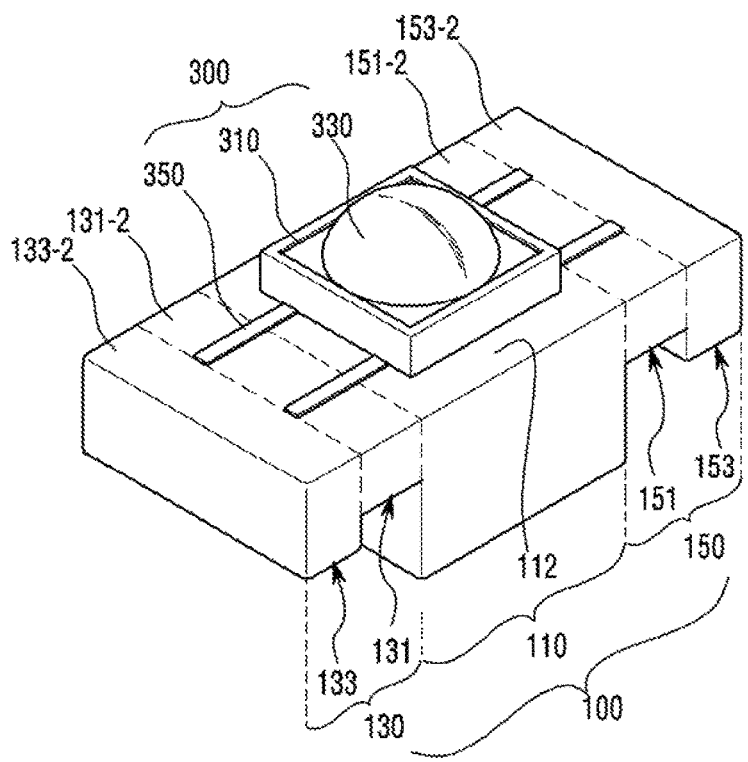
FIG. 4 is a perspective view of a light source module according to a second embodiment.
Figure 8:
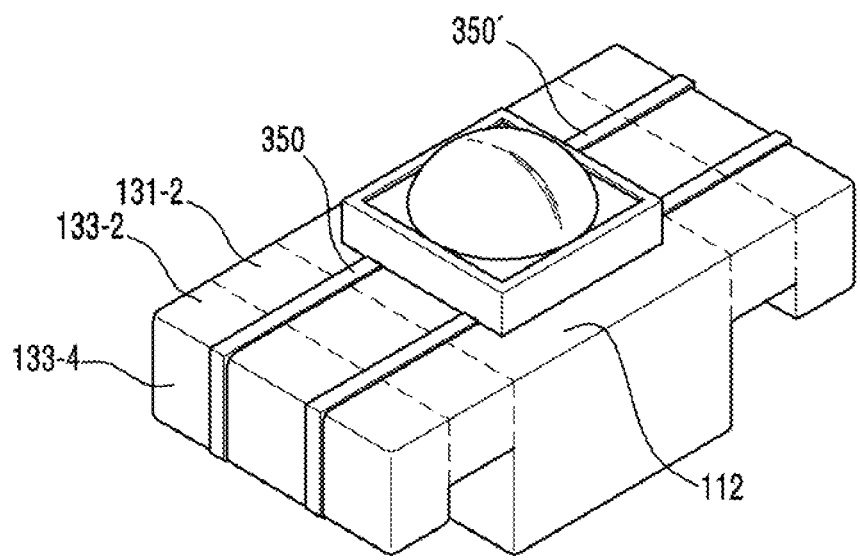
Figure 8:
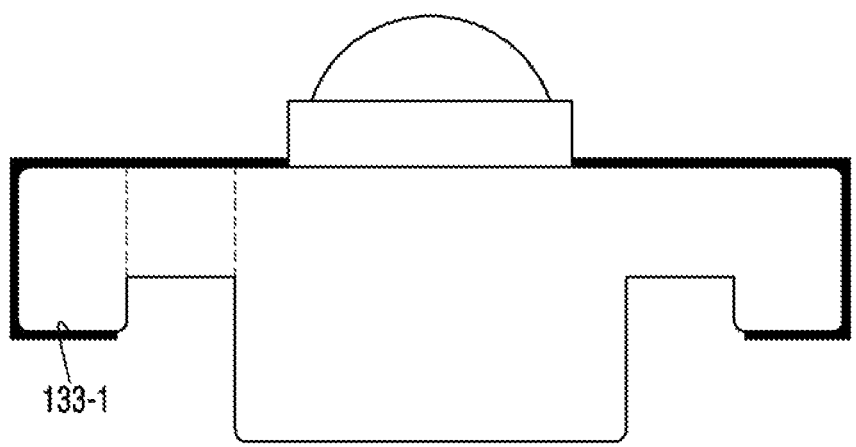
Figure 9:
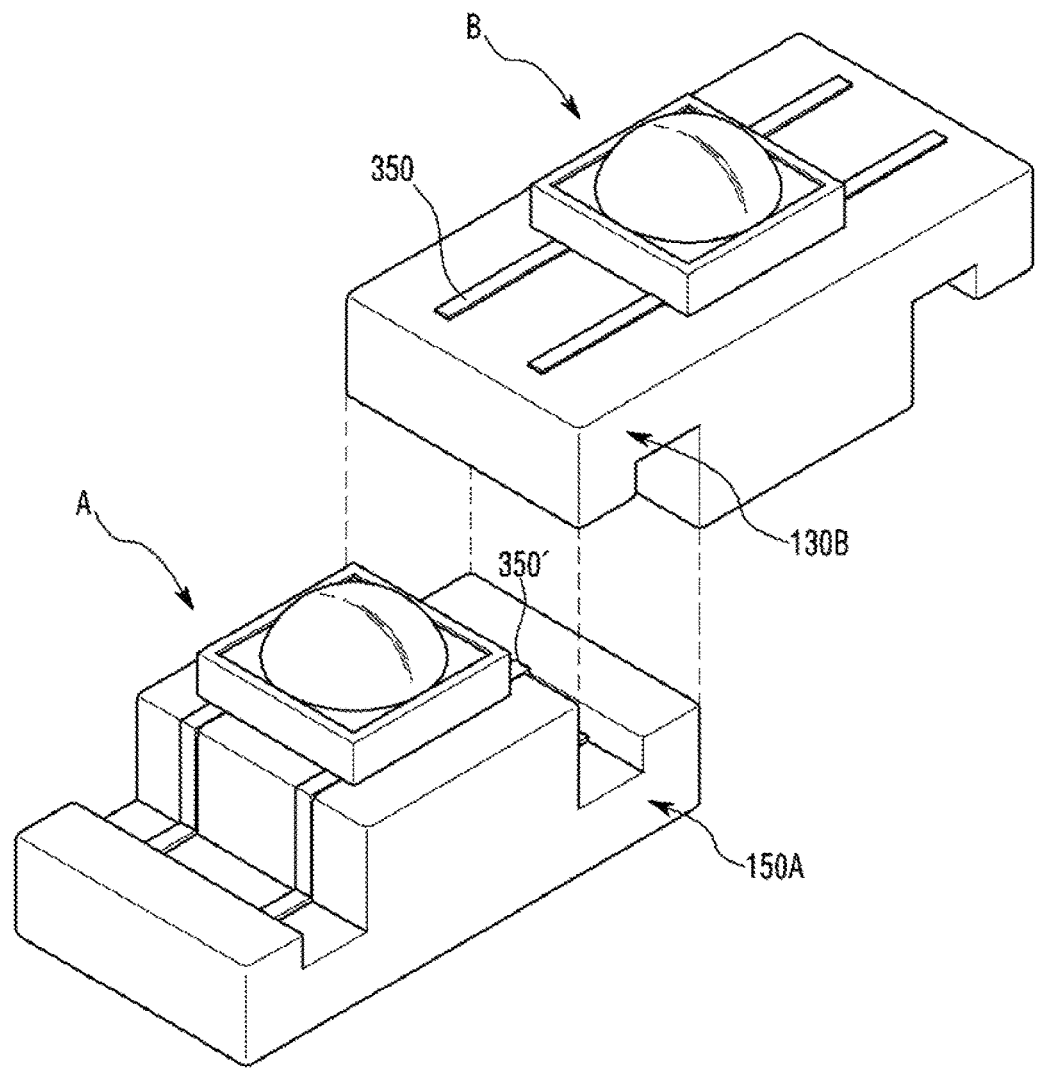
Figure 10:
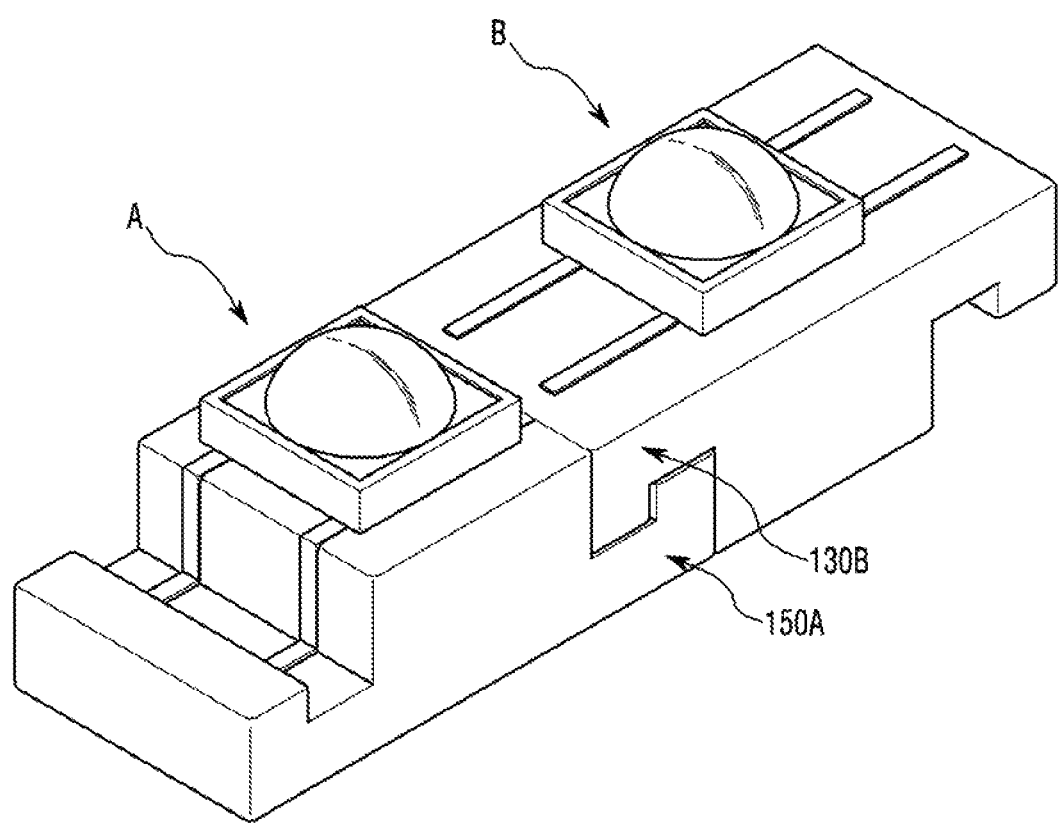
Figure 11:
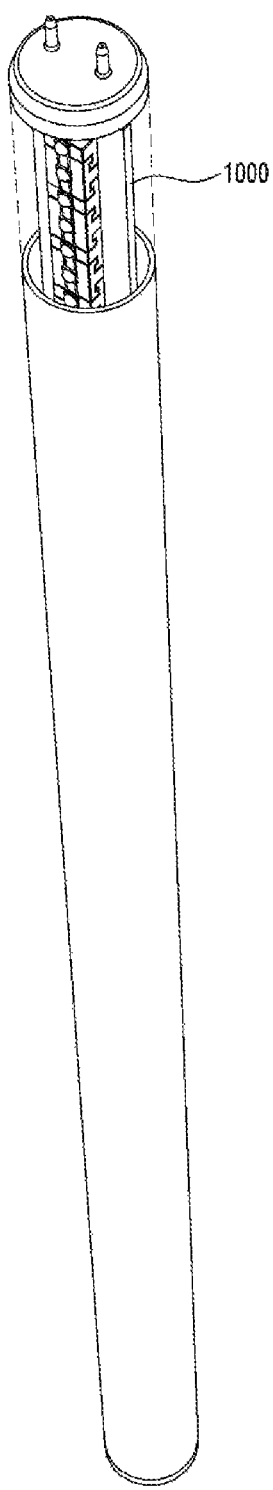
Figure 12:
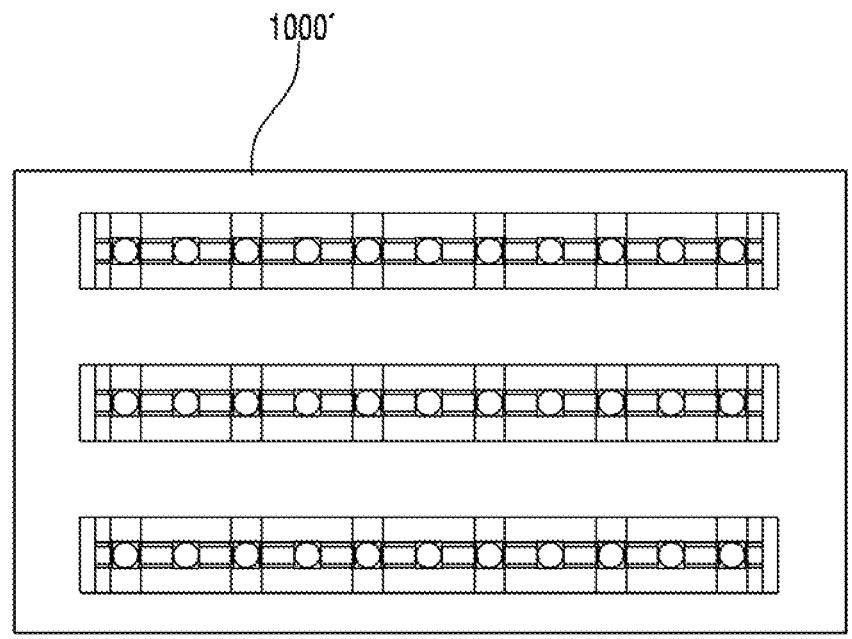
Figure 12:
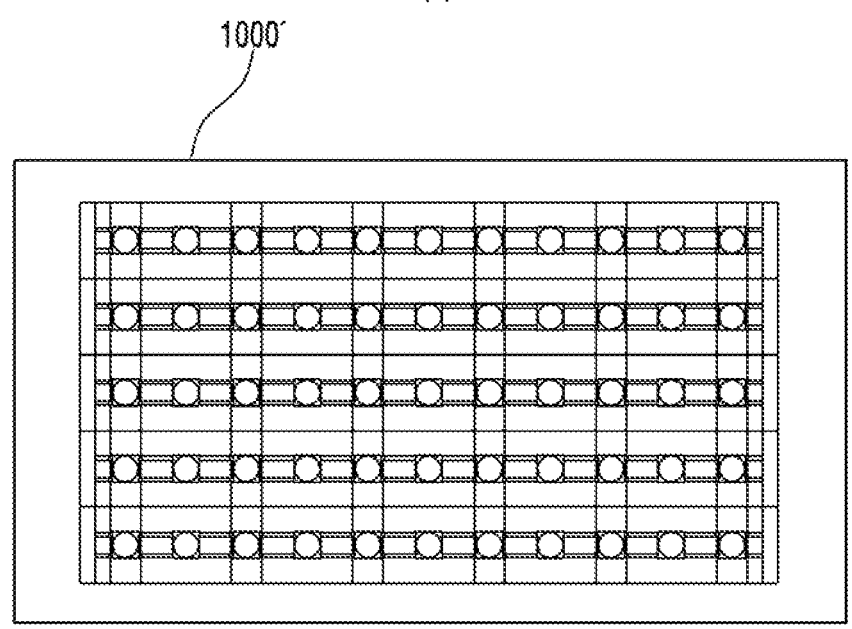
Figure 13:
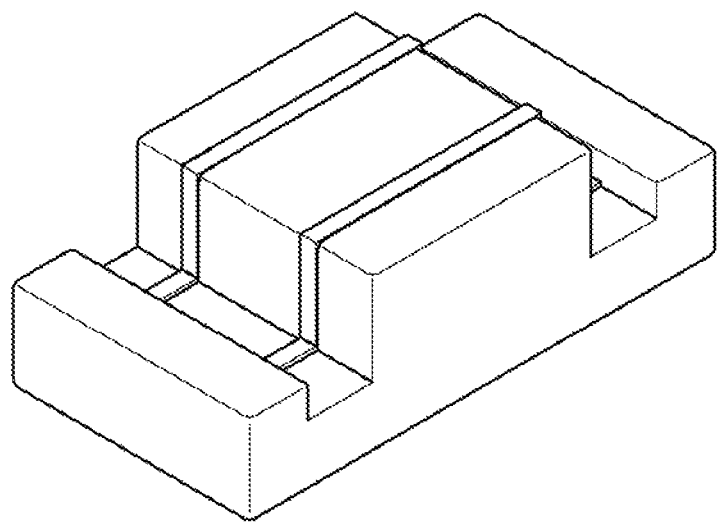
Figure 14:
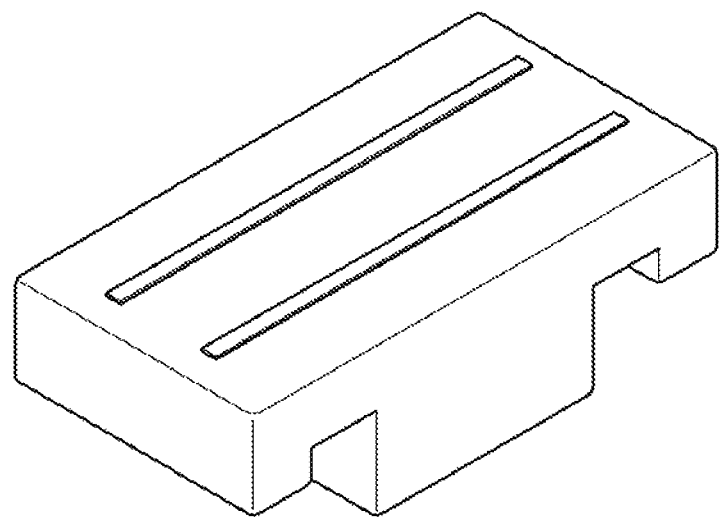
Figure 15:
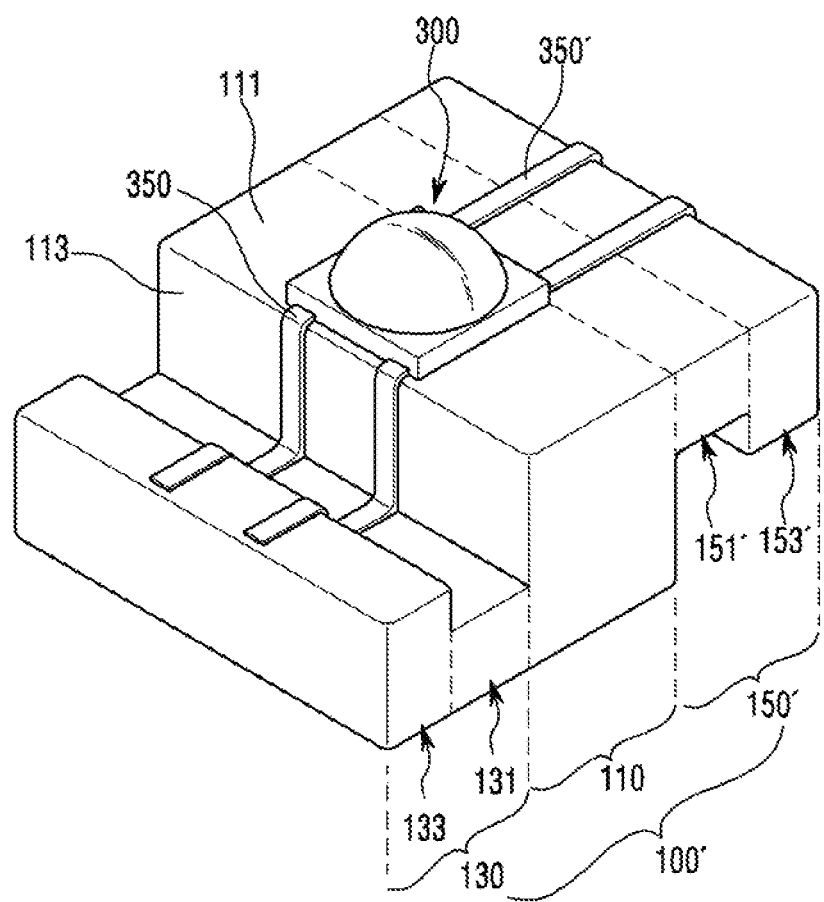
Figure 16:
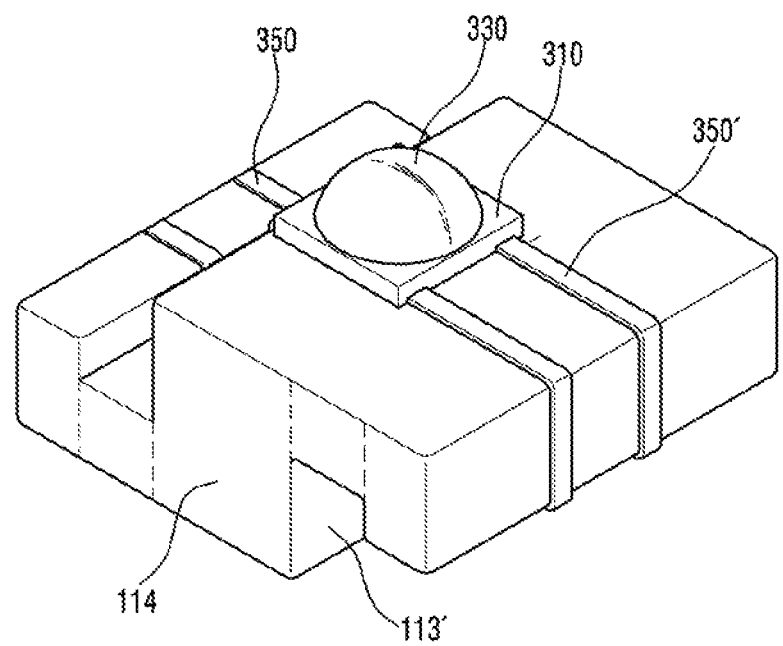
Figure 17:
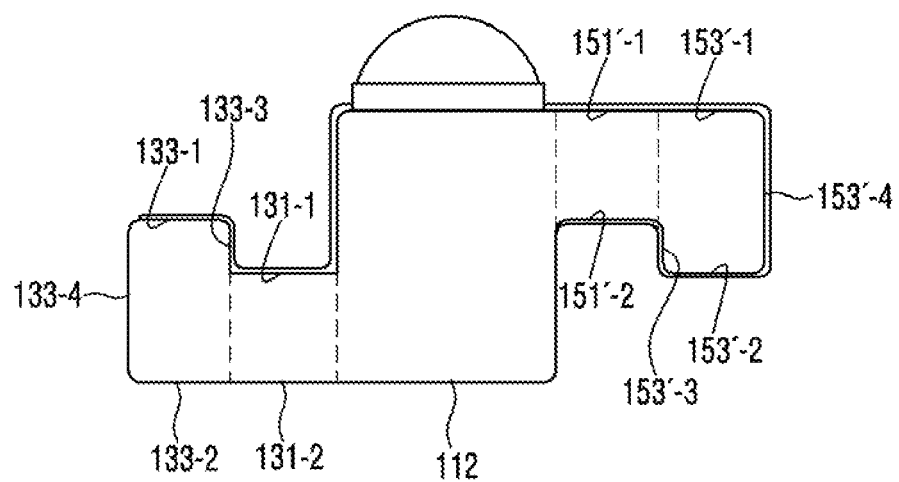
Figure 18:
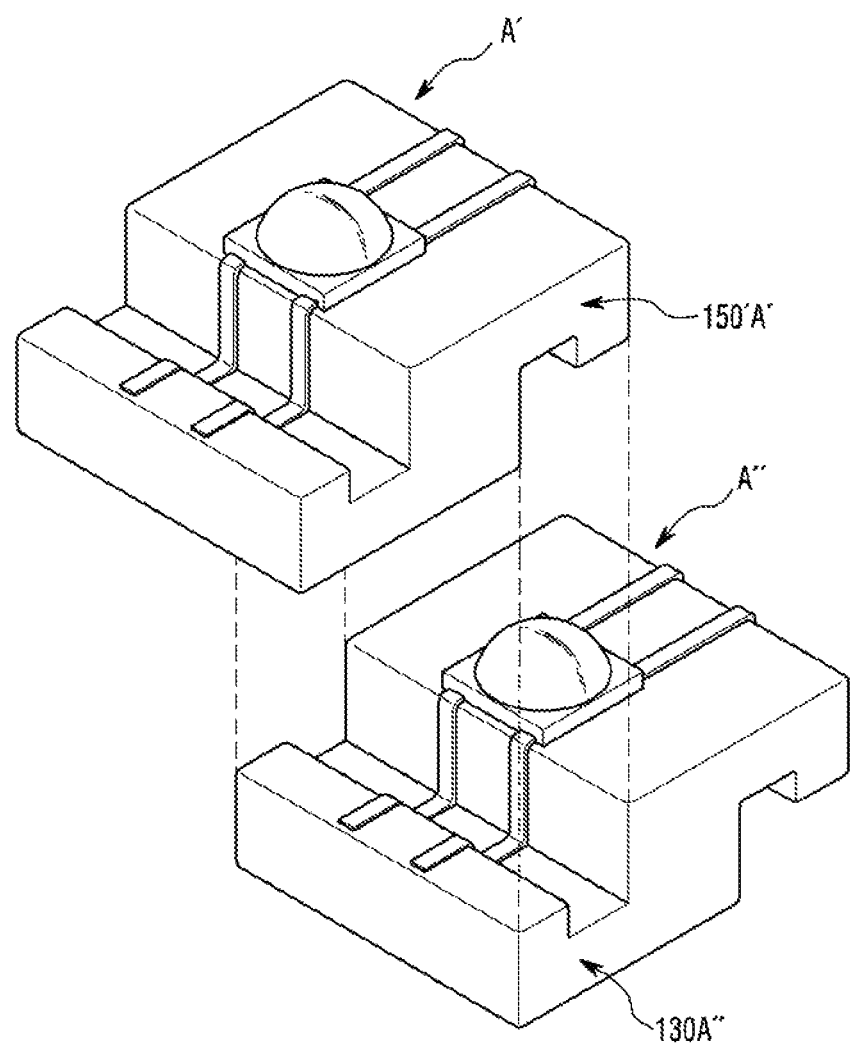
Figure 19:
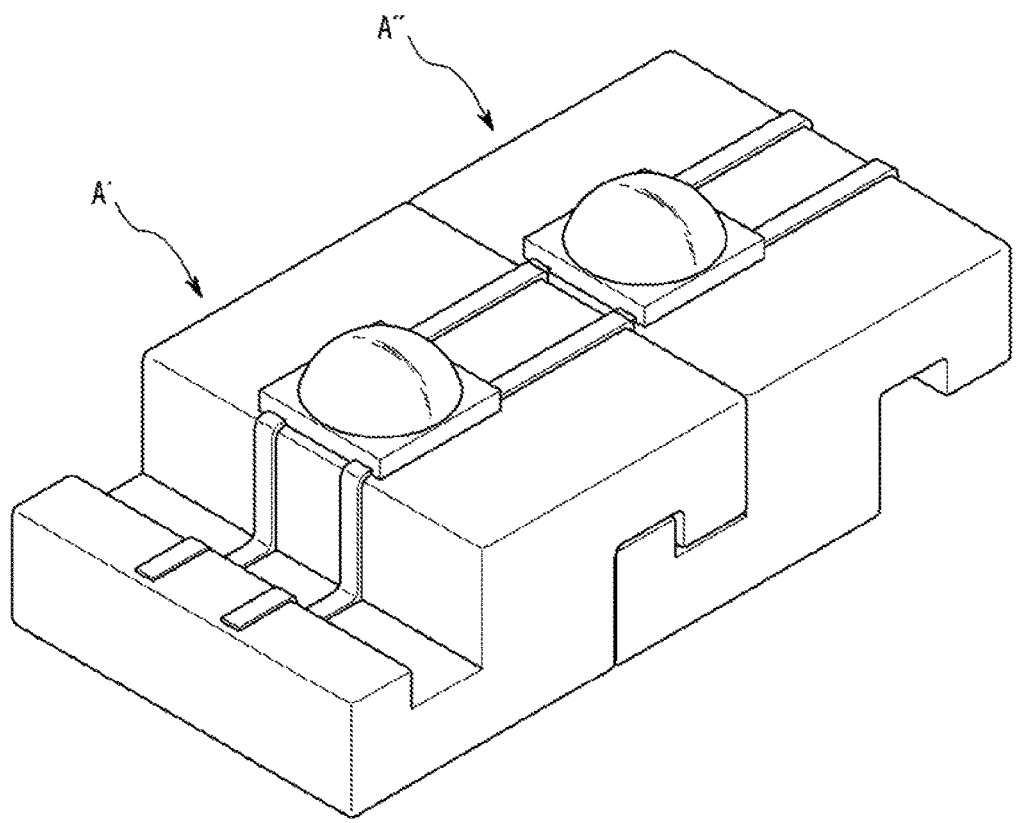
Figure 20:
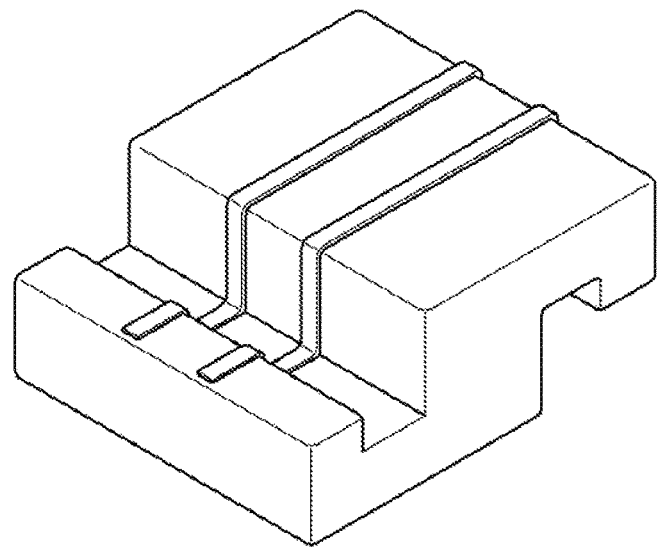

FIG. 8 shows a modified example of the light source module according to the second embodiment shown in FIG. 4;

FIG. 9 is a perspective view showing a state immediately before the light source module according to the first embodiment is coupled to the light source module according to the second embodiment;

FIG. 10 is a perspective view showing a state immediately after the light source module according to the first embodiment is coupled to the light source module according to the second embodiment;

FIG. 11 is an exploded perspective view of an example in which the light source module according to the first embodiment and the light source module according to the second embodiment have been applied to a fluorescent lamp;

FIG. 12 is an exploded perspective view of an example in which the light source module according to the first embodiment and the light source module according to the second embodiment have been applied to a flat panel lighting device;

FIG. 13 is a perspective view of a light source module according to a third embodiment;

FIG. 14 is a perspective view of a light source module according to a fourth embodiment;

FIG. 15 is a perspective view of a light source module according to a fifth embodiment;

FIG. 16 is a perspective view of the light source module shown in FIG. 15 as viewed from other side;

FIG. 17 is a side view of the light source module shown in FIG. 15;

FIG. 18 is a perspective view showing a state immediately before the two light source modules according to the fifth embodiment are coupled to each other;

FIG. 19 is a perspective view showing a state immediately after the two light source modules according to the fifth embodiment are coupled to each other; and FIG. 20 is a perspective view of a light source module according to a sixth embodiment.

MODE FOR INVENTION

A thickness or size of each layer is magnified, omitted or schematically shown for the purpose of convenience and clearness of description. The size of each component does not necessarily mean its actual size.

In description of embodiments of the present invention, when it is mentioned that an element is formed "on" or "under" another element, it means that the mention includes a case where two elements are formed directly contacting with each other or are formed such that at least one separate element is interposed (indirectly) between the two elements. The "on" and "under" will be described to include the upward and downward directions based on one element.

Hereinafter, a light source module according to an embodiment of the present invention will be described with reference to the accompanying drawings.

Figure 1:
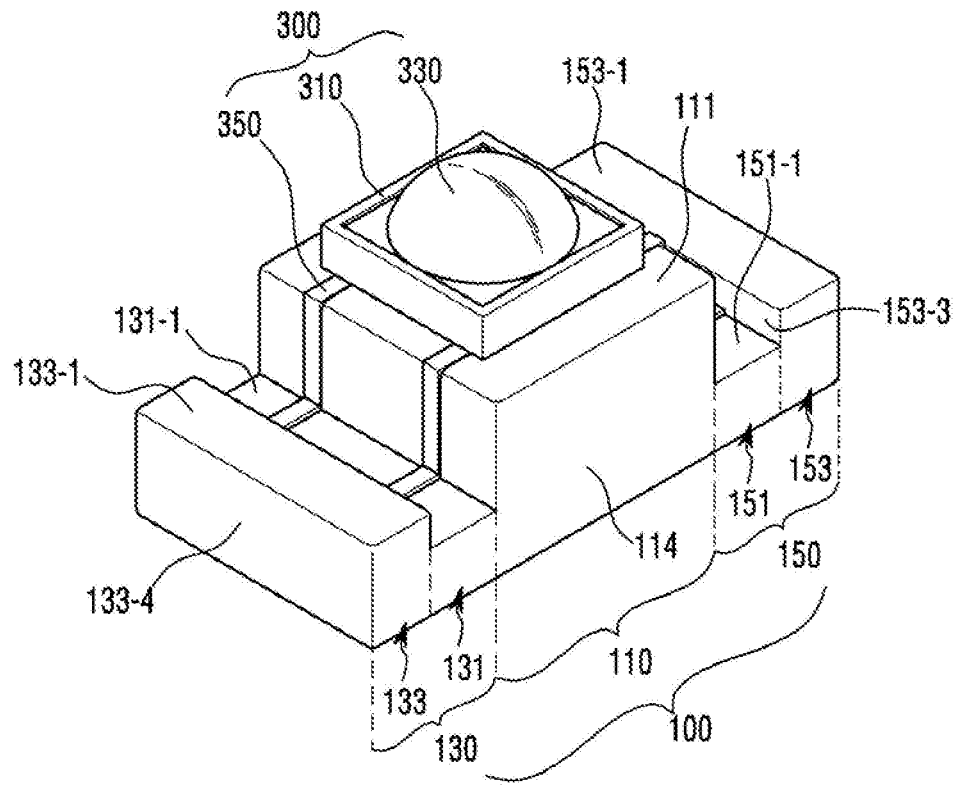
FIG. 1 is a perspective view of a light source module according to a first embodiment.
Figure 2:
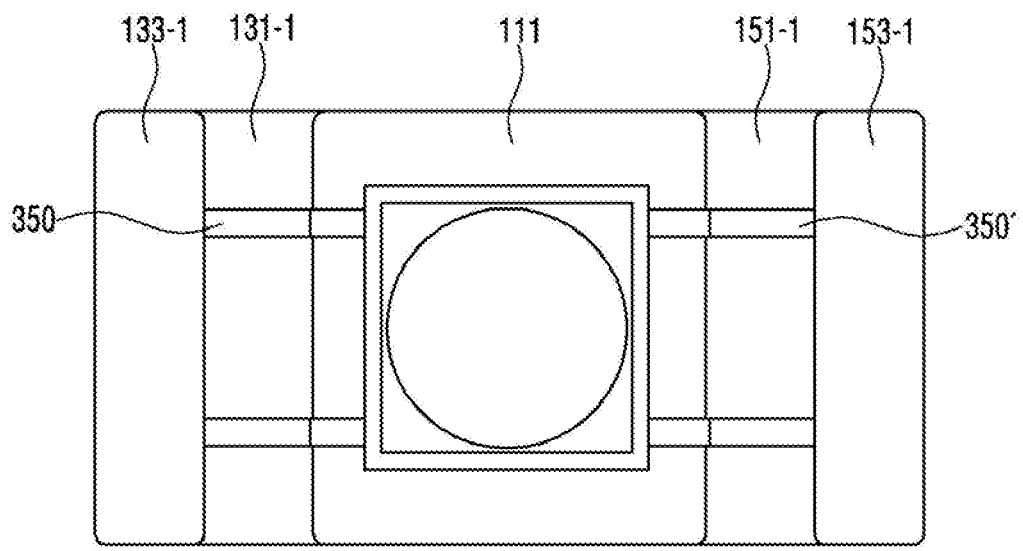
FIG. 2 is a plan view of the light source module shown in FIG. 1.
Figure 3:
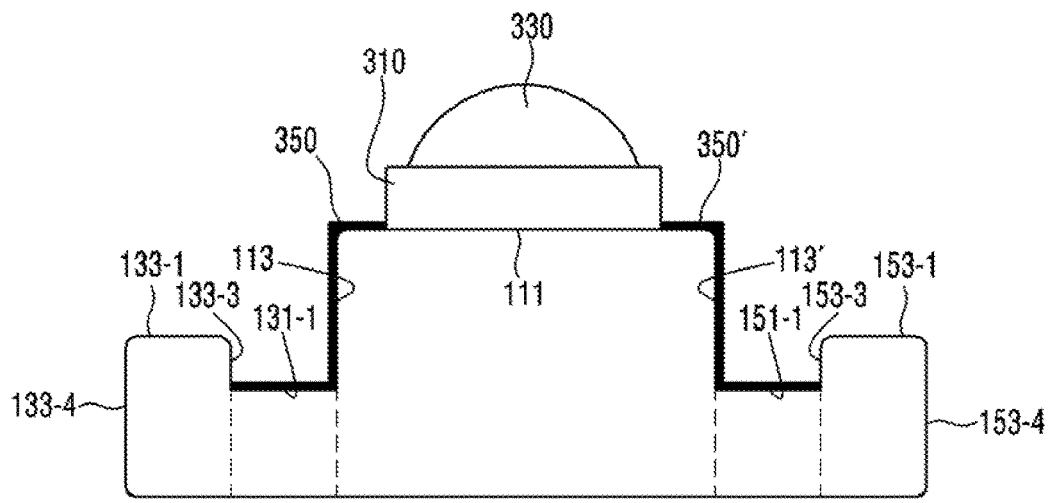
FIG. 3 is a side view of the light source module shown in FIG. 1.

FIG. 1 is a perspective view of a light source module according to a first embodiment. FIG. 2 is a plan view of the light source module shown in FIG. 1. FIG. 3 is a side view of the light source module shown in FIG. 1.

Meanwhile, FIG. 4 is a perspective view of a light source module according to a second embodiment. FIG. 5 is a plan view of the light source module shown in FIG. 4. FIG. 6 is a side view of the light source module shown in FIG. 4.

As shown in FIGS. 1 to 3, the light source module according to the first embodiment includes a body 100 and a light emitting device 300. Meanwhile, as shown in FIGS. 4 to 6, the light source module according to the second embodiment includes the body 100 and the light emitting device 300 as well.

The shape and the structure of the body 100 of the light source module according to the first embodiment are the same as those of the body 100 of the light source module according to the second embodiment. The shape and the structure of the body 100 will be described later in detail with reference to the drawings.

The external structure of the light emitting device 300 of the light source module according to the first embodiment is the same as that of the light emitting device 300 of light source module according to the second embodiment. Here, while the external structure of the light emitting device 300 according to the first embodiment is the same as that of the light emitting device 300 according to the second embodiment, the color temperature or wavelength of light emitted from the light emitting device 300 according to the first embodiment may be the same as or different from the color temperature or wavelength of light emitted from the light emitting device 300 according to the second embodiment. The external structure of the light emitting device 300 will be described later in detail with reference to the drawings.

The light source module according to the first embodiment is structurally different from the light source module according to the second embodiment in that the positions where the light emitting device 300 is disposed in the body 100 are different from each other. Specifically, while the light emitting device 300 is disposed on a first surface of the body 100 in the light source module according to the first embodiment, the light emitting device 300 is disposed on a second surface of the body 100 in the light source module according to the second embodiment. Here, the second surface is different from the first surface. The second surface may be a back side of the first surface. Here, the first surface may be a top surface and the second surface may be a bottom surface. The top surface may face, correspond to, or be opposite to the bottom surface.

Hereinafter, after the structure of the body 100 of the light source module according to the first embodiment and the light source module according to the second embodiment shown in FIGS. 1 to 6 will be described in detail with reference to FIG. 7, the light source module according to the first embodiment shown in FIGS. 1 to 3 and the light source module according to the second embodiment shown in FIGS. 4 to 6 will be described in detail.

A perspective view of the body 100 shown in FIGS. 1 to 6 is shown in (a) to (b) of FIG. 7.

Referring to (a) to (b) of FIG. 7, the body 100 may include a main body 110 and subsidiary bodies 130 and 150.

The main body 110 may have a hexahedral shape.

The main body 110 may include a top surface 111, a bottom surface 112, and four sides 113, 114, and 114'.

The top surface 111 is a back side or rear side of the bottom surface 112. A plurality of the sides 113, 114, and 114' may be disposed between the top surface 111 and the bottom surface 112. The plurality of the sides 113, 114, and 114' include a first to a fourth sides 113, 114, and 114'. The first side 113 is a back side or rear side of the second side (not shown). The third side 114 is a back side or rear side of the fourth side 114'. Here, the third and the fourth sides 114 and 114' may be, as shown in the drawings, flat or may be curved or polygonal.

The subsidiary bodies 130 and 150 may include a first subsidiary body 130 and a second subsidiary body 150.

The first subsidiary body 130 and the second subsidiary body 150 may be disposed on both sides of the main body 110 respectively. Specifically, the first subsidiary body 130 may be disposed on one side of the main body 110, and the second subsidiary body 150 may be disposed on the other side of the main body 110. One side of the main body 110 may face, correspond to, or be opposite to the other side of the main body 110. The main body 110 may be disposed between the first subsidiary body 130 and the second subsidiary body 150.

The first subsidiary body 130 may be coupled to the main body 110. Specifically, the first subsidiary body 130 may be coupled to the lower portion of the first side 113 of the main body 110.

The first subsidiary body 130 may be formed to extend from the main body 110. The first subsidiary body 130 may include a first extension part 131 and a second extension part 133.

The first extension part 131 may be formed to extend from the first side 113 of the main body 110. Here, the first extension part 131 may be formed to extend upward from the lower portion of the first side 113 of the main body 110.

The second extension part 133 may be formed to extend from the first extension part 131. Therefore, the first extension part 131 is disposed between the second extension part 133 and the main body 110.

The first extension part 131 includes a top surface 131-1 and a bottom surface 131-2. The top surface 131-1 is disposed lower than the top surface 111 of the main body 110 and is disposed lower than a top surface 133-1 of the second extension part 133. The bottom surface 131-2 is disposed on the same plane with the bottom surface 112 of the main body 110 and is disposed on the same plane with a bottom surface 133-2 of the second extension part 133.

The second extension part 133 includes the top surface 133-1 and the bottom surface 133-2. The top surface 133-1 is disposed lower than the top surface 111 of the main body 110 and is disposed higher than the top surface 131-1 of the first extension part 131. The bottom surface 133-2 is disposed on the same plane with the bottom surface 112 of the main body 110 and is disposed on the same plane with the bottom surface 131-2 of the first extension part 131.

The second extension part 133 includes an inner side surface (not shown) and an outer side surface 133-4. The inner side surface (not shown) is a back side of the outer side surface 133-4. The inner side surface (not shown) of the second extension part 133 is formed because the top surface 133-1 of the second extension part 133 is disposed higher than the top surface 131-1 of the first extension part 131.

A length from the bottom surface 131-2 to the top surface 131-1 of the first extension part 131 is less than a length from the bottom surface 112 to the top surface 111 of the main body 110 and is less than a length from the bottom surface 133-2 to the top surface 133-1 of the second extension part 133. The length from the bottom surface 133-2 to the top surface 133-1 of the second extension part 133 is less than the length from the bottom surface 112 to the top surface 111 of the main body 110 and is greater than the length from the bottom surface 131-2 to the top surface 131-1 of the first extension part 131.

Here, a sum of the length from the bottom surface 131-2 to the top surface 131-1 of the first extension part 131 and the length from the bottom surface 133-2 to the top surface 133-1 of the second extension part 133 may be the same as or less than the length from the bottom surface 112 to the top surface 111 of the main body 110. This is intended to ensure that the top surface of the main body of the body in which the light emitting device of the light source module "A" according to the first embodiment is disposed is disposed on the same plane with the bottom surface of the first subsidiary body of the body in which the light emitting device of the light source module "B" according to the second embodiment is disposed, when the light source module "A" according to the first embodiment and the light source module "B" according to the second embodiment are, as shown in FIG. 10, coupled to each other.

Referring back to FIG. 7, the second subsidiary body 150 will be described.

The second subsidiary body 150 may be coupled to the main body 110. Specifically, the second subsidiary body 150 may be coupled to the lower portion of the second side (not shown) of the main body 110.

The second subsidiary body 150 may be formed to extend from the main body 110. The second subsidiary body 150 may include a first extension part 151 and a second extension part 153.

The first extension part 151 may be formed to extend from the second side (not shown) of the main body 110. Here, the first extension part 151 may be formed to extend upward from the lower portion of the second side (not shown) of the main body 110.

The second extension part 153 may be formed to extend from the first extension part 151. Therefore, the first extension part 151 is disposed between the second extension part 153 and the main body 110.

The first extension part 151 includes a top surface 151-1 and a bottom surface 151-2. The top surface 151-1 is disposed lower than the top surface 111 of the main body 110 and is disposed lower than a top surface 153-1 of the second extension part 153. The bottom surface 151-2 is disposed on the same plane with the bottom surface 112 of the main body 110 and is disposed on the same plane with the bottom surface 153-2 of the second extension part 153.

The second extension part 153 includes the top surface 153-1 and the bottom surface 153-2. The top surface 153-1 is disposed lower than the top surface 111 of the main body 110 and is disposed higher than the top surface 151-1 of the first extension part 151. The bottom surface 153-2 is disposed on the same plane with the bottom surface 112 of the main body 110 and is disposed on the same plane with the bottom surface 151-2 of the first extension part 151.

The second extension part 153 includes an inner side surface 153-3 and an outer side surface (not shown). The inner side surface 153-3 is a back side of the outer side surface (not shown). The inner side surface 153-3 of the second extension part 153 is formed because the top surface 153-1 of the second extension part 153 is disposed higher than the top surface 151-1 of the first extension part 151.

A length from the bottom surface 151-2 to the top surface 151-1 of the first extension part 151 is less than a length from the bottom surface 112 to the top surface 111 of the main body 110 and is less than a length from the bottom surface 153-2 to the top surface 153-1 of the second extension part 153. The length from the bottom surface 153-2 to the top surface 153-1 of the second extension part 153 is less than the length from the bottom surface 112 to the top surface 111 of the main body 110 and is greater than the length from the bottom surface 151-2 to the top surface 151-1 of the first extension part 151.

Here, a sum of the length from the bottom surface 151-2 to the top surface 151-1 of the first extension part 151 and the length from the bottom surface 153-2 to the top surface 153-1 of the second extension part 153 may be the same as or less than the length from the bottom surface 112 to the top surface 111 of the main body 110.

The first subsidiary body 130 and the second subsidiary body 150 may be symmetrical with each other with respect to the main body 110.

The first subsidiary body 130 is disposed on the lower portion of one side of the main body 110. The second subsidiary body 150 is disposed on the lower portion of the other side of the main body 110.

As shown in (b) of FIG. 7, the first subsidiary body 130 may have a hole 131-5 in which a lead frame is disposed, and the second subsidiary body 150 may have a hole 151-5 in which the lead frame is disposed. The holes 131-5 and 151-5 may be formed to pass through the first extension parts 131 and 151 of the first subsidiary body 130 and the second subsidiary body 150. The number of the holes 131-5 and 151-5 may correspond to the number of the lead frames.

As described above, depending on the position where the light emitting device is disposed in the body 100, the light source module according to the first embodiment shown in FIGS. 1 to 3 and the light source module according to the second embodiment shown in FIGS. 3 to 6 are selected. Specifically, according to the light source module according to the first embodiment, the light emitting device 300 is disposed on the top surface 111 of the main body 110 of the body 100. According to the light source module according to the second embodiment, the light emitting device 300 is disposed on the bottom surface 112 of the main body 110 of the body 100. Hereinafter, the light source module according to the first embodiment and the light source module according to the second embodiment will be described in detail.

Referring to FIGS. 1 to 3, the light emitting, device 300 of the light source module according to the first embodiment is disposed on the body 100.

The light emitting device 300 may include a case 310, a cap 330, and a lead frame 350.

A light emitting chip (not shown) which emits predetermined light is disposed within the case 310.

The cap 330 is disposed on the case 310 and covers the light emitting chip (not shown).

The cap 330 may change the wavelength of the light emitted from the light emitting chip (not shown). For this, the cap 330 may include phosphor. The phosphor is excited by the light emitted from the light emitting chip (not shown) and emits light having a wavelength different from that of the light.

The lead frame 350 is connected to the case 310 and is electrically connected to the light emitting chip (not shown) disposed within the case 310.

External electric power is supplied to the light emitting chip (not shown) through the lead frame 350. For this, the lead frame 350 may include an anode lead frame and a cathode lead frame. Here, one anode lead frame and one cathode lead frame may be provided, or a plurality of the anode lead frames and a plurality of the cathode lead frames may be provided. Two anode lead frames and two cathode lead frames are shown in the figure. However, the number of the lead frames is not limited to this. One anode lead frame and one cathode lead frame may be provided, or three or more anode lead frames and three or more cathode lead frames may be provided. Hereinafter, one of the two anode lead frames shown in the figure is defined as the first lead frame 350, and one of the two cathode lead frames shown in the figure is defined as a second lead frame 350'.

The first lead frame 350 and the second lead frame 350' may have a plate shape having a predetermined length and a predetermined thickness. However, the length and the thickness of the lead frame are not limited to this.

The first lead frame 350 is disposed on the body 100. Specifically, the first lead frame 350 may be, as shown in FIG. 3, disposed on the top surface 111 and the first side 113 of the main body 110 and the top surface 131-1 of the first extension part 131 of the first subsidiary body 130. Here, though not shown in the drawings, the first lead frame 350 may further extend and be disposed on the inner side surface 133-3 or the top surface 133-1 of the second extension part 133 as well.

The second lead frame 350' is disposed on the body 100. Specifically, the second lead frame 350' may be, as shown in FIG. 3, disposed on the top surface 111 and the second side 113' of the main body 110 and the top surface 151-1 of the first extension part 151 of the second subsidiary body 150. Here, though not shown in the drawings, the second lead frame 350' may further extend and be disposed on the inner side surface 153-3 or the top surface 153-1 of the second extension part 153 as well.

Referring to FIGS. 4 to 6, the light emitting device 300 of the light source module according to the second embodiment is disposed on the bottom surface 112 of the body 100.

The case 310 and the cap 330 of the light emitting device 300 are disposed on the bottom surface 112 of the main body 110 of the body 100.

The first lead frame 350 is disposed inside and outside the body 100. Specifically, the first lead frame 350 may be disposed on the bottom surface 112 of the main body 110, the bottom surface 131-2 of the first extension part 131 of the first subsidiary body 130, and the inner side surface 133-3 and the top surface 133-1 of the second extension part 133. A portion of the first lead frame 350 may be disposed on the hole 131-5 of the first extension part 131. Here, though not shown in the drawings, the first lead frame 350 may further extend and be disposed on the outer side surface 133-4 of the second extension part 133.

The second lead frame 350' is disposed inside and outside the body 100. Specifically, the second lead frame 350' may be disposed on the bottom surface 112 of the main body 110, the bottom surface 151-2 of the first extension part 151 of the second subsidiary body 150, and the inner side surface 153-3 and the top surface 153-1 of the second extension part 153. A portion of the second lead frame 350' may be disposed on the hole 151-5 of the first extension part 151. Here, though not shown in the drawings, the second lead frame 350' may further extend and be disposed on the outer side surface 153-4 of the second extension part 153.

Meanwhile, the lead frames 350 and 350' shown in FIGS. 4 to 6 may be disposed only outside the body 100. Specifically, this will be described with reference to FIG. 8.

FIG. 8 shows a modified example of the light source module according to the second embodiment shown in FIG. 4. A perspective view of the modified example of the light source module according to the second embodiment is shown in (a) of FIG. 8. A side view of the modified example of the light source module according to the second embodiment shown in (a) of FIG. 8 is shown in (b) of FIG. 8.

Referring to (a) to (b) of FIG. 8, unlike the lead frames 350 and 350' shown in FIGS. 4 to 6, a portion of the first lead frame 350 is not disposed within the body 100.

The first lead frame 350 is disposed on the outer surface of the body 100. Specifically, the first lead frame 350 may be disposed on the bottom surface 112 of the main body 110, the bottom surface 131-2 of the first extension part 131 of the first subsidiary body 130, and the bottom surface 133-2, the outer side surface 133-4, and the top surface 133-1 of the second extension part 133 of the first subsidiary body 130. Here, the first lead frame 350 may not be disposed on the top surface 133-1 of the second extension part 133.

The second lead frame 350' may be disposed in the same shape as that of the first lead frame 350.

The light source module according to the second embodiment shown in FIGS. 4 to 6 can be electrically and mechanically coupled to the light source module according to the first embodiment shown in FIGS. 1 to 3. The electrical and mechanical coupling of the light source module according to the first embodiment shown in FIGS. 1 to 3 and the light source module according to the second embodiment shown in FIGS. 4 to 6 will be described in detail with reference to FIGS. 9 to 10.

FIGS. 9 to 10 are views for describing the electrical and mechanical coupling of the light source module according to the first embodiment and the light source module according to the second embodiment shown. FIG. 9 is a perspective view showing a state immediately before the light source module according to the first embodiment is coupled to the light source module according to the second embodiment. FIG. 10 is a perspective view showing a state immediately after the light source module according to the first embodiment is coupled to the light source module according to the second embodiment.

For convenience of description, the light source module according to the first embodiment shown in FIGS. 9 to 10 is defined as a first light source module "A", and the light source module according to the second embodiment is defined as a second light source module "B".

Referring to FIG. 9, the first subsidiary body 130B of the second light source module "B" is located above the second subsidiary body 150A of the first light source module "A". When any one of the first light source module "A" and the second light source module "B" is moved downward or upward, the second subsidiary body 150A of the first light source module "A" and the first subsidiary body 130B of the second light source module "B" are, as shown in FIG. 10, mechanically coupled to each other. In addition to the mechanical coupling of the first light source module "A" and the second light source module "B", the lead frame 350' of the first light source module "A" comes in direct contact with the lead frame 350 of the second light source module "B", so that the first light source module "A" and the second light source module "B" are electrically connected to each other.

As such, the light source module according to the first embodiment and the light source module according to the second embodiment are once mechanically coupled to each other, and simultaneously with this, they can be electrically connected to each other.

The light source module according to the second embodiment is coupled to the light source module according to the first embodiment, and then the light source module according to the first embodiment is coupled again to the light source module according to the second embodiment. In this way, the light source modules according to the first and second embodiments can continue to be extended in one direction. Therefore, a designer of the light source module according to the embodiment can obtain a light source having a desired length by using a suitable number of the light source modules according to the first embodiment and a suitable number of the light source modules according to the second embodiment. For example, as shown in FIG. 11, the light source module according to the first embodiment and the light source module according to the second embodiment are continuously coupled and then can be used in a fluorescent lamp. A plurality of the first light source modules and a plurality of the second light source modules may be alternately disposed on a substrate 1000 disposed within the fluorescent lamp.

Also, as shown in FIG. 12, the light source module according to the first embodiment and the light source module according to the second embodiment are coupled and then can be used in a flat panel lighting device. A plurality of the first light source modules and a plurality of the second light source modules may be disposed in a plurality of rows on a substrate 1000' disposed within the flat panel lighting device. Here, the plurality of rows are, as shown in (a) of FIG. 12, disposed separately from each other, or the plurality of rows are, as shown in (b) of FIG. 12, disposed to contact with each other.

Meanwhile, the modified example of the light source module according to the second embodiment shown in FIG. 8 can be also electrically and mechanically coupled to the light source module according to the first embodiment shown in FIGS. 1 to 3.

FIG. 13 is a perspective view of a light source module according to a third embodiment. FIG. 14 is a perspective view of a light source module according to a fourth embodiment.

The light source modules according to the third and fourth embodiments shown in FIGS. 13 and 14 are obtained by disposing only the lead frame 350 on the body 100 without the case 310 and the cap 330 of the light emitting device 300 in the light source modules according to the first and second embodiments shown in FIGS. 1 and 3.

The light source modules according to the third and fourth embodiments cannot emit predetermined light because the light source modules according to the third and fourth embodiments does not include a light emitting chip emitting the light. However, the light source modules according to the third and fourth embodiments are able to function to electrically connect the light source modules coupled to both sides thereof.

Meanwhile, the body 100 itself shown in FIG. 7 may be used in the light source module of a lighting apparatus. For example, when the light source module according to the first embodiment and the light source module according to the second embodiment are alternately connected and the electrical connection between the light source modules is required to be disconnected, the body 100 may be only mechanically coupled to a position where the electrical connection is required to be disconnected.

The light source modules according to the first to fourth embodiments and the body shown in FIG. 7 may be configured as one package. A user who has purchased the one package is able to implement a light source having a user's favorite length or size by means of the light source modules according to the first to fourth embodiments and the body shown in FIG. 7.

FIG. 15 is a perspective view of a light source module according to a fifth embodiment. FIG. 16 is a perspective view of the light source module shown in FIG. 15 as viewed from other side. FIG. 17 is a side view of the light source module shown in FIG. 15.

Referring to FIGS. 15 to 17, the light source module according to the fifth embodiment includes a body 100' and the light emitting device 300.

The body 100' may include the main body 110, the first subsidiary body 130 and the second subsidiary body 150'.

The main body 110 may have a hexahedral shape.

The main body 110 may include the top surface 111, the bottom surface 112, and four sides 113, 113', and 114. The top surface 111 is a back side or rear side of the bottom surface 112. A plurality of the sides 113, 113', and 114 may be disposed between the top surface 111 and the bottom surface 112. The plurality of the sides 113, 113', and 114 include the first to fourth sides 113, 113', and 114. The first side 113 is a back side or rear side of the second side 113'. The third side 114 is a back side or rear side of the fourth side (not shown). Here, the third and the fourth sides may be, as shown in the drawings, flat or may be curved or polygonal.

The subsidiary bodies 130 and 150 may include the first subsidiary body 130 and the second subsidiary body 150'.

The first subsidiary body 130 may be disposed on one side of the main body 110, and the second subsidiary body 150' may be disposed on the other side of the main body 110. Therefore, the main body 110 may be disposed between the first subsidiary body 130 and the second subsidiary body 150'.

The first subsidiary body 130 may be coupled to the main body 110. Specifically, the first subsidiary body 130 may be coupled to the lower portion of the first side 113 of the main body 110.

The first subsidiary body 130 may include the first extension part 131 and the second extension part 133.

The first extension part 131 may be formed to extend from the first side 113 of the main body 110. Here, the first extension part 131 may be formed to extend from the lower portion of the first side 113 of the main body 110.

The second extension part 133 may be formed to extend from the first extension part 131. Therefore, the first extension part 131 is disposed between the second extension part 133 and the main body 110.

The first extension part 131 includes the top surface 131-1 and the bottom surface 131-2. The top surface 131-1 is disposed lower than the top surface 111 of the main body 110 and is disposed lower than the top surface 133-1 of the second extension part 133. The bottom surface 131-2 is disposed on the same plane with the bottom surface 112 of the main body 110 and is disposed on the same plane with the bottom surface 133-2 of the second extension part 133.

The second extension part 133 includes the top surface 133-1 and the bottom surface 133-2. The top surface 133-1 is disposed lower than the top surface 111 of the main body 110 and is disposed higher than the top surface 131-1 of the first extension part 131. The bottom surface 133-2 is disposed on the same plane with the bottom surface 112 of the main body 110 and is disposed on the same plane with the bottom surface 131-2 of the first extension part 131.

The second extension part 133 includes an inner side surface 133-3 and an outer side surface 133-4. The inner side surface 133-3 is a back side of the outer side surface 133-4. The inner side surface 133-3 of the second extension part 133 is formed because the top surface 133-1 of the second extension part 133 is disposed higher than the top surface 131-1 of the first extension part 131.

A length from the bottom surface 131-2 to the top surface 131-1 of the first extension part 131 is less than a length from the bottom surface 112 to the top surface 111 of the main body 110 and is less than a length from the bottom surface 133-2 to the top surface 133-1 of the second extension part 133. The length from the bottom surface 133-2 to the top surface 133-1 of the second extension part 133 is less than the length from the bottom surface 112 to the top surface 111 of the main body 110 and is greater than the length from the bottom surface 131-2 to the top surface 131-1 of the first extension part 131.

Here, a sum of the length from the bottom surface 131-2 to the top surface 131-1 of the first extension part 131 and the length from the bottom surface 133-2 to the top surface 133-1 of the second extension part 133 may be the same as or less than the length from the bottom surface 112 to the top surface 111 of the main body 110. This is intended to ensure that the top surface of the main body of the body in which the light emitting device of one light source module "A'" is disposed is disposed on the same plane with the bottom surface of the first subsidiary body of the body in which the light emitting device of the other light source module "A''" is disposed, when the two light source modules "A' and A''" are, as shown in FIG. 19, coupled to each other.

The second subsidiary body 150' may be symmetrical with the first subsidiary body 130 with respect to the internal center point of the main body 110. This is the difference from the second subsidiary body 150 shown in FIGS. 1 to 6. That is, while the second subsidiary body 150 shown in FIGS. 1 to 6 is symmetrical with the first subsidiary body 130 with respect to the main body 110, the second subsidiary body 150' shown in FIGS. 15 to 17 is symmetrical with the first subsidiary body 130 with respect to the internal center point of the main body 110.

The second subsidiary body 150' may be coupled to the main body 110. Specifically, the second subsidiary body 150' may be coupled to the upper portion of the second side 113' of the main body 110.

The second subsidiary body 150' may include a first extension part 151' and a second extension part 153'.

The first extension part 151' may be formed to extend from the second side 113' of the main body 110. Here, the first extension part 151' may be formed to extend from the upper portion of the second side 113' of the main body 110.

The second extension part 153' may be formed to extend from the first extension part 151'. The first extension part 151' is disposed between the second extension part 153' and the main body 110.

The first extension part 151' includes a top surface 151'-1 and a bottom surface 151'-2. The bottom surface 151'-2 is disposed higher than the bottom surface 112 of the main body 110 and is disposed higher than a bottom surface 153'-2 of the second extension part 153'. The top surface 151'-1 is disposed on the same plane with the top surface 111 of the main body 110 and is disposed on the same plane with a top surface 153'-1 of the second extension part 153'.

The second extension part 153' includes the top surface 153'-1 and the bottom surface 153'-2. The bottom surface 153'-2 is disposed higher than the bottom surface 112 of the main body 110 and is disposed lower than the bottom surface 151'-2 of the first extension part 151'. The top surface 153'-1 is disposed on the same plane with the top surface 111 of the main body 110 and is disposed on the same plane with the top surface 151'-1 of the first extension part 151'.

The second extension part 153' includes an inner side surface 153'-3 and an outer side surface 153'-4. The inner side surface 153'-3 is a back side of the outer side surface 153'-4. The inner side surface 153'-3 of the second extension part 153' is formed because the bottom surface 153'-2 of the second extension part 153' is disposed lower than the bottom surface 151'-2 of the first extension part 151'.

The light emitting device 300 is disposed on the body 100'.

The light emitting device 300 may include the case 310, the cap 330, and the lead frames 350 and 350'.

A light emitting chip (not shown) which emits predetermined light is disposed within the case 310.

The cap 330 is disposed on the case 310 and covers the light emitting chip (not shown).

The cap 330 may change the wavelength of the light emitted from the light emitting chip (not shown). For this, the cap 330 may include phosphor. The phosphor is excited by the light emitted from the light emitting chip (not shown) and emits light having a wavelength different from that of the light.

The lead frames 350 and 350' are connected to the case 310 and are electrically connected to the light emitting chip (not shown) disposed within the case 310.

Electric power is supplied to the light emitting chip (not shown) through the lead frames 350 and 350'. For this, the lead frames 350 and 350' may include the anode lead frame 250 and the cathode lead frame 350'. Here, one anode lead frame 350 and one cathode lead frame 350' may be provided, or a plurality of the anode lead frames 350 and a plurality of the cathode lead frames 350' may be provided. Two anode lead frames 350 and two cathode lead frames 350' are shown in the figure. However, the number of the lead frames is not limited to this. Three or more anode lead frames 350 and three or more cathode lead frames 350' may be provided. Hereinafter, one of the two anode lead frames shown in the figure is defined as the first lead frame 350, and one of the two cathode lead frames shown in the figure is defined as the second lead frame 350'.

The first lead frame 350 and the second lead frame 350' may have a plate shape having a predetermined length and a predetermined thickness.

The case 310 and the cap 330 of the light emitting device 300 are disposed on the top surface 111 of the main body 110.

The first lead frame 350 of the light emitting device 300 is disposed on the main body 110 and the first subsidiary body 130. Specifically, the first lead frame 350 may be disposed on the top surface 111 and the first side 113 of the main body 110, on the top surface 131-1 of the first extension part 131 of the first subsidiary body 130, and on the inner side surface 133-3 and the top surface 133-1 of the second extension part 133 of the first subsidiary body 130.

The second lead frame 350' of the light emitting device 300 is disposed on the main body 110 and the second subsidiary body 150'. Specifically, the second lead frame 350' may be disposed on the top surface 111 of the main body 110, on the top surface 151'-1 of the first extension part 151' of the second subsidiary body 150', on the outer side surface 153'-4, the bottom surface 153'-2, and the inner side surface 153'-3 of the second extension part 153' of the second subsidiary body 150', and on the bottom surface 151'-2 of the first extension part 151'.

The light source module according to the fifth embodiment shown in FIGS. 15 to 17 can be electrically and mechanically coupled to a light source module having the same shape and structure as those thereof. The electrical and mechanical coupling of the light source modules according to the fifth embodiment shown in FIGS. 15 to 17 will be described in detail with reference to FIGS. 18 to 19.

FIGS. 18 to 19 are views for describing the electrical and mechanical coupling of the light source modules according to the fifth embodiment. Specifically, FIG. 18 is a perspective view showing a state immediately before the two light source modules according to the fifth embodiment are coupled to each other. FIG. 19 is a perspective view showing a state immediately after the two light source modules according to the fifth embodiment are coupled to each other.

For convenience of description, one of the two light source modules according to the fifth embodiment shown in FIGS. 18 to 19 is defined as a first light source module "A'", and the other is defined as a second light source module "A''".

Referring to FIG. 18, the first subsidiary body 130A'' of the second light source module "A''" is disposed under the second subsidiary body 150'A' of the first light source module "A'". When any one of the first light source module "A'" and the second light source module "A''" is moved downward or upward, the second subsidiary body 150'A' of the first light source module "A'" and the first subsidiary body 130A'' of the second light source module "A''" are, as shown in FIG. 19, mechanically coupled to each other. In addition to this, as shown in FIGS. 15 to 17, the lead frame 350' of the first light source module "A'" comes in direct contact with the lead frame 350 of the second light source module "A''", so that the first light source module "A'" and the second light source module "A''" are electrically connected to each other.

A designer of the light source module can obtain a light source having a desired length by repeatedly coupling the light source modules according to the fifth embodiment.

Also, the light source modules according to the fifth embodiment can be used in the fluorescent lamp shown in FIG. 11 or in the flat panel lighting device shown in FIG. 12.

FIG. 20 is a perspective view of a light source module according to a sixth embodiment.

Referring to FIG. 20, the light source module according to the sixth embodiment is obtained by disposing only the lead frame 350 on the body 100' on the body 100' without the case 310 and the cap 330 of the light emitting device 300 in the light source module according to the fifth embodiment shown in FIGS. 15 to 17.

The light source module according to the sixth embodiment cannot emit light because the light source module according to the sixth embodiment does not include a light emitting chip emitting the light. However, the light source module according to the sixth embodiment is able to function to electrically connect the light source modules coupled to both sides thereof.

Meanwhile, the body 100' itself shown in FIG. 15 may be used. For example, when the light source modules according to the fifth embodiment are connected and the electrical connection between the light source modules is required to be disconnected, the body 100' itself may be mechanically coupled to a position where the electrical connection is required to be disconnected.

The light source modules shown in FIGS. 5 to 6 and the body shown in FIG. 15 may be configured as one package. A user who has purchased the one package is able to implement a light source having a user's favorite length or size by means of the light source modules according to the fifth to sixth embodiments and the body shown in FIG. 15.

Although the embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

The invention claimed is:

1. A light source module comprising a body in which a light emitting device is disposed,
   wherein the body comprises:
      a main body comprising a top surface, a bottom surface, a first side, and a second side;
      a first subsidiary body disposed on the first side of the main body; and
      a second subsidiary body disposed on the second side of the main body,
   wherein the first subsidiary body comprises a first extension part extending from the first side and a second extension part extending from the first extension part,
   wherein each of the first extension part and the second extension part has a top surface and a bottom surface,
   wherein the bottom surface of the first extension part and the bottom surface of the second extension part are disposed on the same plane with the bottom surface of the main body,
   wherein the top surface of the first extension part is disposed lower than the top surface of the second extension part and the top surface of the main body, and the top surface of the second extension part is disposed lower than the top surface of the main body,
   and wherein the second subsidiary body is symmetrical with the first subsidiary body with respect to the main body.

2. The light source module of claim 1, wherein a sum of a length from the bottom surface of the first extension part to the top surface of the first extension part and a length from the bottom surface to the top surface of the second extension part is the same as or less than a length from the bottom surface to the top surface of the main body.

3. The light source module of claim 1,
   wherein the light emitting device comprises:
      a case which is disposed on the top surface of the main body and comprises a light emitting chip therein;

a cap which is disposed on the case and covers the light emitting chip; and a lead frame which is connected to the case and is electrically connected to the light emitting chip, wherein the lead frame is disposed on the top surface of the main body, on the first side of the main body, and on the top surface of the first extension part.

4. The light source module of claim 3, wherein the cap comprises phosphor.

5. The light source module of claim 1, wherein the light emitting device comprises:

a case which is disposed on the bottom surface of the main body and comprises a light emitting chip therein;

a cap which is disposed on the case and covers the light emitting chip; and a lead frame which is connected to the case and is electrically connected to the light emitting chip, wherein the first extension part has a hole, wherein the second extension part comprises an inner side surface and an outer side surface, and wherein the lead frame is disposed on the bottom surface of the main body, on the bottom surface of the first extension part, on the hole of the first extension part, and on the inner side surface and the top surface of the second extension part.

6. The light source module of claim 5, wherein the cap comprises phosphor.

7. The light source module of claim 1, wherein the light emitting device comprises:

a case which is disposed on the bottom surface of the main body and comprises a light emitting chip therein;

a cap which is disposed on the case and covers the light emitting chip; and a lead frame which is connected to the case and is electrically connected to the light emitting chip, wherein the second extension part comprises an inner side surface and an outer side surface, and wherein the lead frame is disposed on the bottom surface of the main body, on the bottom surface of the first extension part, and on the bottom surface and the outer side surface of the second extension part.

8. The light source module of claim 7, wherein the lead frame is disposed on the top surface of the second extension part.

9. The light source module of claim 7, wherein the cap comprises phosphor.

10. A light source module comprising a body in which a light emitting device is disposed, wherein the body comprises:

a main body comprising a top surface, a bottom surface, a first side, and a second side;

a first subsidiary body disposed on the first side of the main body; and a second subsidiary body disposed on the second side of the main body, wherein the first subsidiary body comprises a first extension part extending from the first side and a second extension part extending from the first extension part, wherein each of the first extension part and the second extension part has a top surface and a bottom surface, wherein the bottom surface of the first extension part and the bottom surface of the second extension part are disposed on the same plane with the bottom surface of the main body, wherein the top surface of the first extension part is disposed lower than the top surface of the second extension part and the top surface of the main body, and the top surface of the second extension part is disposed lower than the top surface of the main body, and wherein the second subsidiary body is symmetrical with the first subsidiary body with respect to an internal center point of the main body.

11. The light source module of claim 10, wherein a sum of a length from the bottom surface of the first extension part to the top surface of the first extension part and a length from the bottom surface to the top surface of the second extension part is the same as or less than a length from the bottom surface to the top surface of the main body.

12. The light source module of claim 10, wherein the second subsidiary body comprises a first extension part extending from an upper portion of the second side and a second extension part extending from the first extension part, wherein each of the first extension part of the second subsidiary body and the second extension part of the second subsidiary body comprises a top surface and a bottom surface, wherein the second extension part of the second subsidiary body comprises an outer side surface and an inner side surface, wherein the light emitting device comprises:

a case which is disposed on the top surface of the main body and comprises a light emitting chip therein;

a cap which is disposed on the case and covers the light emitting chip; and a first and a second lead frame which is connected to the case and is electrically connected to the light emitting chip, wherein the first lead frame is disposed on the top surface of the main body, on the first side of the main body, and on the top surface of the first extension part of the First subsidiary body, and wherein the second lead frame is disposed on the top surface of the main body, on the top surface of the first extension part of the second subsidiary body, and on the top surface, the outer side surface, and the bottom surface of the second extension part of the second subsidiary body.

13. The light source module of claim 12, wherein the cap comprises phosphor.

14. The light source module of claim 12, wherein the first lead frame is disposed on the top surface of the second extension part of the first subsidiary body, and wherein the second lead frame is disposed the bottom surface of the first extension part of the second subsidiary body.

15. A light source module comprising a body and a lead frame disposed on the body, wherein the body comprises:

a main body comprising a top surface, a bottom surface, a first side, and a second side;

a first subsidiary body disposed on the first side of the main body; and a second subsidiary body disposed on the second side of the main body, wherein the first subsidiary body comprises a first extension part extending from the first side and a second extension part extending from the first extension part, wherein each of the first extension part and the second extension part has a top surface and a bottom surface, wherein the bottom surface of the first extension part and the bottom surface of the second extension part are disposed on the same plane with the bottom surface of the main body, wherein the top surface of the first extension part is disposed lower than the top surface of the second extension part and the top surface of the main body, and the top surface of the second extension part is disposed lower than the top surface of the main body, and wherein the lead frame is disposed on the top surface of the main body, on the first side of the main body, and on the top surface of the first extension part.

16. The light source module of claim 15, wherein the second subsidiary body is symmetrical with the first subsidiary body with respect to the main body.

17. The light source module of claim 15, wherein the second subsidiary body is symmetrical with the first subsidiary body with respect to an internal center point of the main body.

18. The light source module of claim 15, wherein a plurality of the lead frames are disposed separately from each other.

\* \* \* \* \*